United States Patent [19]

Tobin

[11] Patent Number: 4,548,654

[45] Date of Patent: Oct. 22, 1985

[54] SURFACE DENUDING OF SILICON WAFER

[75] Inventor: Philip J. Tobin, Scottsdale, Ariz.

[73] Assignee: Motorola, Inc., Schaumburg, Ill.

[21] Appl. No.: 500,735

[22] Filed: Jun. 3, 1983

[51] Int. Cl.[4] .................. H01L 21/265; H01L 7/54; H01L 21/322
[52] U.S. Cl. .................. 148/1.5; 29/576 B; 29/576 T; 148/187; 148/DIG. 23; 148/DIG. 24; 357/91
[58] Field of Search ............... 148/1.5, 187, DIG. 23, 148/DIG. 24; 29/576 B, 576 T; 357/91

[56] References Cited

U.S. PATENT DOCUMENTS

| | | | |
|---|---|---|---|
| 4,116,719 | 9/1978 | Shimizu et al. | 148/1.5 |
| 4,220,483 | 9/1980 | Cazcarra | 148/1.5 |
| 4,314,595 | 2/1982 | Yamamoto et al. | 148/1.5 |
| 4,364,779 | 12/1982 | Kamgar | 148/1.5 |
| 4,376,657 | 3/1983 | Nagasawa et al. | 148/1.5 |
| 4,437,922 | 3/1984 | Bischoff et al. | 156/603 |

FOREIGN PATENT DOCUMENTS

| | | | |
|---|---|---|---|
| 0060676 | 9/1982 | European Pat. Off. | 29/576 T |
| 0066461 | 12/1982 | European Pat. Off. | |
| 2080780 | 2/1982 | United Kingdom | 29/576 T |

OTHER PUBLICATIONS

Chakravarti et al., IBM-TDB, 25, (1982), 1910.
Craven et al., Solid St. Tech., Jul. 1985, p. 55.

*Primary Examiner*—Upendra Roy
*Attorney, Agent, or Firm*—John A. Fisher

[57] ABSTRACT

A process is disclosed for preparing silicon wafers having a high quality, high lifetime surface layer and a bulk region characterized by a low lifetime and by a high density of precipitated oxygen gettering sites. A wafer having a relatively high concentration of interstitial oxygen is heated in a reducing ambient at a sufficiently high temperature and a sufficiently long time to cause a surface layer to be denuded of oxygen related defects and dislocations. The temperature is then ramped down to a lower temperature and the wafer is maintained at this lower temperature for a sufficient time to allow precipitation of oxygen within the bulk of the wafer.

14 Claims, 6 Drawing Figures

SURFACE DENUDING OF SILICON WAFER

BACKGROUND OF THE INVENTION

This invention relates generally to semiconductor devices and, more specifically, to a silicon wafer having a high quality denuded zone and to semiconductor devices formed thereon.

There are a number of semiconductor devices which are improved by being fabricated in semiconductor material having a high minority carrier lifetime. The current gain of a bipolar transistor, for example, is proportional to minority carrier lifetime. The refresh time of an MOS dynamic RAM, that is, the length of time the dynamic RAM retains memory without refresh, is also directly related to minority carrier lifetime. With such devices, of which these are but two examples, it is desirable or even necessary, therefore, to fabricate the device in a semiconductor wafer having at least a localized portion characterized by high minority carrier lifetime.

In addition, there are a number of semiconductor devices which further require or benefit from a region of low lifetime material proximate the high lifetime active device region. For example, low lifetime material lowers the recovery time of a bipolar switching transistor by suppressing the concentration of injected minority carriers. In a dynamic MOS circuit the nearby low lifetime material makes the circuit less sensitive to "soft" failures resulting from alpha particle generated minority carriers. The low lifetime material also suppresses parasitic currents (row disturb failures) which can cause faulty memory retention.

A localized region of low lifetime material has a further advantage if the low lifetime results from defects in the crystalline structure of the semiconductor material. During device processing these crystalline defects act as gettering sites for other defects and impurities and therefore aid in maintaining the high lifetime characteristic of the high quality material located nearby.

It is desirable, therefore, to have silicon wafers characterized by a surface layer of high lifetime material on a low lifetime bulk.

Techniques have been developed in an effort to achieve such silicon wafers having appropriate regions of high and low lifetimes. One such technique, for example, involves internal gettering at oxygen precipitates in the bulk of the wafer combined with denuding a surface layer of oxygen defects. To achieve the structure, silicon wafers are grown having a moderate to high concentration of interstitial oxygen. A surface layer is then denuded of oxygen related defects by heating the wafer in either an inert or an oxidizing ambient for a sufficient time for interstitial oxygen to diffuse to the wafer surface where it is removed from the wafer. Following the denuding step, oxygen is caused to precipitate in the bulk of the wafer by heating for an extended length of time at a temperature in the range of about 600°–800° C. While the foregoing process has proved partially successful in providing the desired structure, it has the shortcoming that it leaves a fairly high concentration of random defects in the surface layer. These defects, in turn, result in poor yield of devices fabricated on the wafers.

It is therefore an object of the present invention to provide an improved process for denuding a surface layer of a silicon wafer.

It is an another object of the invention to provide an improved process for preparing a silicon substrate for the fabrication of a semiconductor device.

It is yet another object of the invention to provide an improved semiconductor device.

BRIEF SUMMARY OF THE INVENTION

The foregoing and other objects and advantages of the invention are achieved through the use of a reducing ambient denuding process. Silicon wafers having a moderate to high concentration of oxygen incorporated therein are heated to an elevated temperature in a reducing ambient to allow interstitial oxygen to diffuse from a surface layer of the wafer. The particular temperature and the time at which the wafer remains at that temperature determine the depth of the denuded zone. Following the high temperature reducing ambient treatment, the wafer is annealed at a second lower temperature. During the cooling from the first temperature and while the wafer is at the second temperature, oxygen precipitates nucleate in the bulk of the wafer. The nucleation of oxygen precipitates prepares the bulk of the wafer for large scale oxygen precipitation during later thermal treatment encountered during normal device processing.

DETAILED DESCRIPTION OF THE PREFERRED EMBODIMENTS

Figure 1:
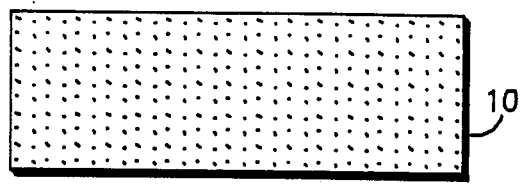
FIGS. 1 and 2 illustrate steps in the denuding process in accordance with the invention.

Most silicon wafers used in the semiconductor industry are grown by the Czochralski process in which a single crystal ingot is pulled from a melt. The crucible holding the silicon melt is typically of silica, a portion of which is dissolved by the molten silicon. In this manner, oxygen from the crucible is incorporated into the melt and then into the growing ingot. The ingot is then sliced into a plurality of wafers which are lapped and polished to the desired thickness and surface finish. FIG. 1 illustrates in cross section a silicon wafer 10 which is uniformly doped with interstitial oxygen indicated by the stipling. For internal gettering, the interstitial oxygen should be of medium to high concentration in the wafer and preferably is of a concentration greater than about $1.3$–$1.4 \times 10^{18}$ cm$^{-3}$ (26–28 ppm). At such a concentration the wafer is super saturated with oxygen. Under proper conditions, with such a concentration of interstitial oxygen, some of the excess oxygen can be made to precipitate, providing a low lifetime region as well as internal gettering sites.

For most semiconductor devices, however, active device regions must be located in a region of high quality, high lifetime semiconductor material, not in material having high concentrations of oxygen precipitates. Oxygen precipitates intersecting a pn junction or within a depletion region associated with a pn junction, for example, increase the leakage current of the junction. In accordance with the invention a denuded layer, that is, a high quality layer of semiconductor material having a substantially reduced defect density compared to the bulk of the wafer, is formed at the wafer surface. The thickness of the denuded surface layer is at least sufficient to accommodate the critical active device regions. The bulk of the wafer, underlying the denuded layer, is characterized by a high concentration of oxygen precipitates and related defects which act as internal gettering sites and reduce the minority carrier lifetime.

Figure 2:
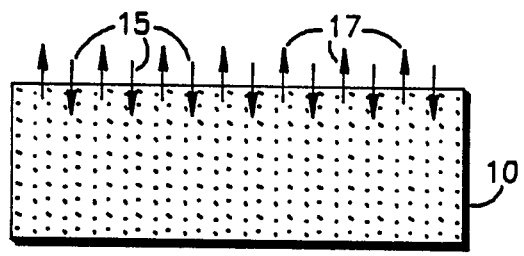

The process in accordance with the invention starts with a silicon wafer having a high concentration of oxygen included therein. The silicon wafer is heated to an elevated temperature in a reducing ambient, and preferably in a nonfilm forming reducing ambient, i.e., an ambient which does not cause the formation of a film on the silicon surface. During this heating step oxygen diffuses from the surface of the wafer leaving a denuded layer at the wafer surface. FIG. 2 illustrates schematically what is believed to be happening to the oxygen doped wafer during, for example, a high temperature treatment in hydrogen. At the elevated temperature hydrogen diffuses into the wafer as illustrated by arrows 15. The saturated concentration of hydrogen in silicon is only about 20 ppb. Hydrogen has a very high diffusion coefficient in silicon, so compared to oxygen, hydrogen diffuses throughout the wafer to its saturated concentration almost instantaneously. At the same time that hydrogen is diffusing into the wafer, oxygen is diffusing out of the wafer as represented by arrows 17. The out diffusion of oxygen is controlled by diffusion conditions and the thickness of the resultant denuded layer is proportional to $(Dt)^{\frac{1}{2}}$ where D is the diffusivity of oxygen at the elevated temperature and t is the duration of the high temperature step.

Figure 3:
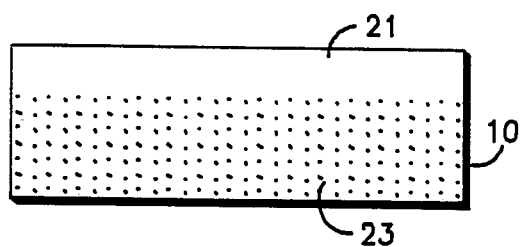
FIG. 3 illustrates in cross-section a silicon wafer prepared in accordance with the invention.

The resultant effect of the high temperature denuding treatment in a reducing ambient is illustrated in FIG. 3. Wafer 10 is characterized by a surface layer 21 which is substantially free from defects. The bulk 23 of wafer 10, that is, the region of wafer 10 located immediately beneath denuded layer 21, is essentially characterized by the initial high oxygen concentration of the wafer. The oxygen concentration of the denuded zone is reduced to a value which is below the oxygen precipitation threshold.

While the inventor does not wish to be bound by any proposed theory nor are the claims to be in any way limited by such proposed theory, it is believed that the superiority of denuding in a reducing ambient results from either the hydrogen modification (acceleration) of the diffusion coefficient of oxygen or from the fact that as the oxygen out diffuses it combines with hydrogen at the surface to form water. The process is enhanced by heating to an elevated temperature in a nonfilm forming ambient; in prior art processes the formation of a film on the wafer surface provided a barrier to the out diffusion of oxygen.

Following the surface denuding treatment, the wafer is lowered in temperature to cause the precipitation of interstitial oxygen and to initiate the formation of an internal gettering structure. The high concentration of oxygen in the bulk of the wafer exceeds the solid solubility of oxygen in silicon; the nucleation treatment causes the precipitation of some of the excess oxygen.

Figure 4:
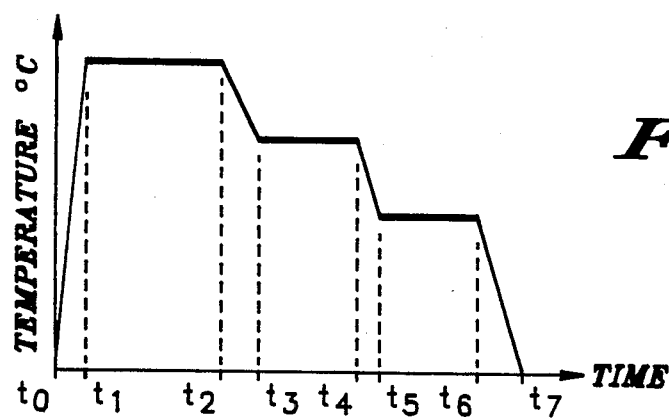
FIG. 4 illustrates a preferred temperature cycle employed in a process in accordance with the invention.

FIG. 4 illustrates a preferred thermal cycle for carrying out the surface denuding and internal oxygen precipitation in accordance with the invention. Wafers having a sufficient concentration of oxygen incorporated therein, that is, high enough to precipitate during processing, are placed in a furnace environment at time $t_0$. At time $t_0$ the wafers are at a low temperature which can be, for example, room temperature. The wafers are then increased in temperature during the time interval $t_0$–$t_1$ to a denuding temperature of about 1000°–1200° C. and preferably a temperature of about 1100° C. The wafers are held at the denuding temperature, in a reducing ambient, from time $t_1$ to time $t_2$, preferably for about 1–4 hours. As noted above, the denuding temperature and the time at which the wafers spend at that temperature determine, in accordance with diffusion principles, the depth of the denuded zone. In one hour at 1150° C., for example, the oxygen concentration in a surface layer of about 18 micrometer thickness is reduced below the oxygen precipitation threshold concentration.

Figure 5:
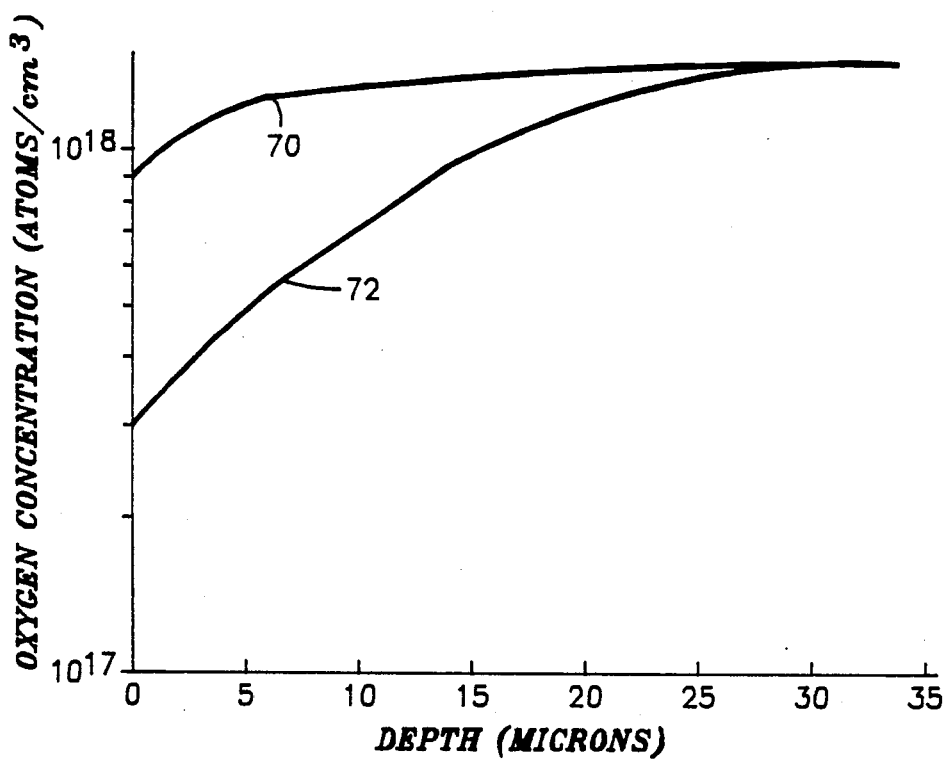
FIG. 5 graphically illustrates comparative results between a layer denuded in accordance with one embodiment of the invention and one denuded by a prior art process.

The oxygen concentration as a function of depth into the wafer is illustrated in FIG. 5. Silicon wafers having an initial oxygen concentration of about $1.65 \times 10^{18}$ cm$^{-3}$ were denuded for one hour at 1150° C. in an oxygen containing ambient (curve 70) and in a reducing ambient (hydrogen) in accordance with the invention (curve 72). The increased depth of denuding with the reducing ambient is apparent.

Again with reference to FIG. 4, following the denuding anneal of desired length, the temperature is lowered during the time interval $t_2$–$t_3$ to a second temperature of about 1000° C. At that temperature the wafers are oxidized during the time interval $t_3$–$t_4$, preferably about 10–100 minutes depending on the ambient, to provide a protective oxide on the wafer surface. The oxidation step is optional, but provides a protective layer which helps protect and maintain the high quality denuded layer. The temperature is ramped down during the time $t_4$–$t_5$ to a nucleation temperature in the range of about 600°–800° C. and preferably to a temperature of about 750° C. During the ramp down time the nucleation of oxygen microprecipitates from the super saturated bulk of the wafer begins. The wafers are held at the nucleation temperature until time $t_6$, preferably about 1–4 hours, to cause the formation of an appreciable number of microprecipitates. Further precipitation and gettering at these sites continues during process steps encountered during the subsequent fabrication of semiconductor devices on the wafers. The precipitates cause crystal dislocations to form around them; impurities are then attracted to the location to form a precipitate dislocation complex (PDC). During subsequent processing the PDC can grow to a size which is optically observable (after a decoration etch). At the conclusion of the precipitation cycle the wafers are lowered in temperature to room temperature at time $t_7$. For most applications the resultant wafer has a denuded zone of about 5–20 micrometers thickness and a heavily precipitated bulk with a density of precipitates of about $10^9$–$10^{10}$ cm$^{-3}$, depending on the initial concentration of oxygen and the exact thermal cycle.

In an alternate embodiment of the invention, the denuding can be done as one step and the defect nucleation as a separate step. In this embodiment (not shown) the wafer is heated to the denuding temperature, annealled in a reducing ambient at that temperature, and then cooled, preferably in the same ambient. In a separate step, the wafer is then heated to the nucleation temperature, either with or without a protective oxide layer, to cause the nucleation of microprecipitates.

The annealing during denuding, in accordance with the invention, is carried out in a reducing ambient, and preferably in a nonfilm forming reducing ambient. The ambient can be, for example, pure hydrogen or hydrogen admixed with an inert gas such as helium or argon. The pure hydrogen presents some safety handling problems, but eliminates the need for providing very pure inert gases. Other ambients can also be used, such as hydrogen admixed with nitrogen. The nitrogen containing ambients are less effective than pure hydrogen because of the tendency to form a nitride film on the silicon surface and because of a tendency for the nitrogen to pit the wafer surface.

Figure 6:
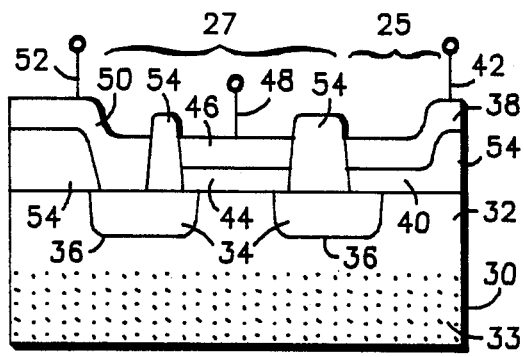
FIG. 6 illustrates in cross-section one semiconductor device fabricated on a denuded silicon wafer.

FIG. 6 illustrates one embodiment of a semiconductor device, in accordance with the invention, fabricated on a substrate prepared as described above. The illustrative device of this embodiment represents one bit of a dynamic MOS RAM. The one bit includes a capacitor 25 for storing information and an MOS transistor 27 for gating information in the form of charges onto that capacitor. The device includes a silicon wafer 30 having a substantially defect free, denuded surface layer 32 overlying an oxygen precipitated bulk 33. Denuded layer 32 is of sufficient thickness to accommodate transistor source and drain regions 34 which form junctions 36 with the denuded region of wafer 30. The denuded layer is also of sufficient thickness to accommodate any depletion region associated with these junctions as well as any "charge packet" associated with capacitor 25.

Capacitor 25 is formed by conductive electrode 38, capacitor dielectric 40, and underlying denuded silicon layer 32, the latter forming the second plate of the capacitor. Connection to electrode 38 is accomplished by interconnection 42. The capacitor dielectric can be, for example, a thin layer of silicon dioxide, silicon nitride, or the like.

Transistor 27 includes a gate insulator 44 which is overlaid by a gate electrode 46. Like the capacitor dielectric, the gate insulator can be a thin layer of silicon dioxide, silicon nitride, or the like. Gate electrode 46 can be metal, polycrystalline silicon, silicide, polycide, or the like. The gate electrode is connected to the rest of the semiconductor circuit by an interconnection electrode 48. The drain of the transistor is contacted by an electrode 50 which, in turn, is connected to circuit interconnection 52. A thick field oxide 54 covers and passivates the remaining portion of the circuit.

In operation as a memory device, the device illustrated in FIG. 6 is used as follows: information is written into or read out from storage capacitor 25. The read or write operation is accomplished by turning on device 27 by applying a read or write pulse to interconnection 48 and thus to gate electrode 46. With transistor 27 thus turned on, information is conveyed either from interconnect 52 through the transistor to capacitor 25 or from the capacitor through the transistor to interconnect 52. The transistor thus acts as a switch permitting the passage of information to or from storage capacitor 25.

Information is stored dynamically on the capacitor as the presence or absence of a charge packet. The dynamic storage requires a high lifetime in denuded layer 32 so that the stored information is retained for the length of time between consecutive write or refresh cycles. If the lifetime is not sufficiently long, the information stored will be lost due to minority carrier recombination.

The low lifetime, high recombination bulk 33 is also important in maintaining stored information. Alpha particles, for example, are responsible for "soft" failures in semiconductor memories. The action of an alpha particle is to create hole-electron pairs in the bulk of the wafer. If the alpha particle generated carriers have sufficient lifetime to migrate to the region of the stored charge, these carriers can annihilate the stored charge and thus disturb the information being retained. Likewise, the addressing of an adjacent row of the memory can generate parasitic currents in the substrate and these can cause annihilation of the stored charge if a sufficiently high lifetime path exists through the substrate for the parasitic current. The presence of a low lifetime, high recombination bulk underlying the high quality denuded zone affectively dampens all parasitic unwanted currents generated in the substrate.

Devices such as that illustrated in FIG. 6 were fabricated on substrates prepared in accordance with the invention, on substrates prepared by prior art denuding processes, and on bulk wafers without a denuding process. Devices fabricated in accordance with the invention were found to have a higher yield and a longer refresh time, both indicating a lower density of defects in the denuded layer.

It has also been observed, for example in the fabrication of devices such as that illustrated in FIG. 6, that the presence of the high quality denuded zone, formed in accordance with the invention, is highly advantageous to the growth of high quality silicon oxides on the surface of that zone. Oxides grown on the surface of denuded layers prepared in accordance with the invention evidence higher quality and lower defects than do similarly formed oxides grown on unprepared surfaces or on surfaces denuded in an oxygen ambient.

Thus it is apparent that there has been provided, in accordance with the invention, a process, structure and device which fully meet the objects and advantages set forth above. While the invention has been illustrated by reference to specific embodiments thereof, it is not intended that the invention be limited to those illustrative embodiments. Variations and modifications differing from the embodiments set forth will be apparent to those skilled in the art after review of the foregoing detailed description. Other device types, denuded zone thicknesses, and the like are illustrative of such variations and modifications. It is therefore intended that all such variations and modifications as fall within the broad scope of the invention be included within the appended claims.

I claim:

1. A process for preparing a silicon substrate for the fabrication of a device which comprises the steps of:
   providing a silicon substrate having a concentration of oxygen incorporated therein;
   heating said substrate to a first elevated temperature in a reducing ambient;
   lowering the temperature of said substrate to a second elevated temperature lower than said first elevated temperature; and
   maintaining said substrate at said second elevated temperature for a time to allow nucleation of oxygen precipitates in the bulk of said substrate.

2. The process of claim 1 wherein said reducing ambient comprises hydrogen.

3. The process of claim 2 wherein said reducing ambient comprises hydrogen diluted with argon or helium.

4. The process of claim 1 wherein said concentration of oxygen exceed $1.3 \times 10^{18}$ cm$^{-3}$.

5. The process of claim 1 wherein said first temperature comprises a temperature between about 1000° C. and about 1200° C.

6. The process of claim 1 wherein said second elevated temperature is about 600°-800° C.

7. The process of claim 5 wherein said first temperature is about 1100°-1150° C.

8. The process of claim 6 further comprising the step of heating said substrate to a temperature intermediate said first and second temperatures in an oxidizing ambient to grow an oxide layer on said substrate.

9. A process for fabricating a semiconductor device which comprises the steps of:
 providing a silicon wafer of first conductivity type having a concentration of oxygen incorporated therein;
 heating said wafer to a temperature between about 1000° and 1200° C. in a reducing ambient for a sufficient time to form a denuded surface layer on said wafer; heating said wafer in an oxidizing ambient to form a protective oxide on the surface thereof; reducing the temperature of said wafer to a second temperature between about 600° and 800° C. to nucleate the precipitation of oxygen in the bulk of said wafer; and
 forming regions of second conductivity type in said denuded surface layer, said regions having a depth into said wafer less than the thickness of said surface layer.

10. A process for preparing a silicon substrate for the fabrication of a device which comprises the steps of: providing a silicon wafer having a concentration of oxygen greater than about $1.3 \times 10^{18}$ cm$^{-3}$ incorporated therein; heating said wafer to a first elevated temperature; annealing said wafer in a reducing ambient at said first elevated temperature for about 1-4 hours; cooling said wafer to a second temperature lower than said first elevated temperature; maintaining said wafer at said second temperature in an oxidizing ambient to form an oxide layer on said wafer; further cooling said wafer to a third temperature lower than said second temperature; and maintaining said wafer at said third temperature for a sufficient time for the nucleation of microprecipitates.

11. The process of claim 10 wherein said first elevated temperature is between about 1000° C. and about 1200° C.

12. The process of claim 11 wherein said third temperature is between about 600° C. and about 800° C.

13. The process of claim 12 wherein said third temperature is about 750° C.

14. The process of claim 12 wherein said first elevated temperature is about 1100° C.

* * * * *